(12) United States Patent
Choy et al.

(10) Patent No.: US 9,540,249 B2
(45) Date of Patent: Jan. 10, 2017

(54) SOLUTION-PROCESSED TRANSITION METAL OXIDES

(71) Applicant: The University of Hong Kong, Hong Kong (CN)

(72) Inventors: Wallace Chik Ho Choy, New Territories (HK); Fengxian Xie, Hong Kong (CN); ChuanDao Wang, Hong Kong (CN)

(73) Assignee: The University of Hong Kong, Hong Kong (HK)

( * ) Notice: Subject to any disclaimer, the term of this patent is extended or adjusted under 35 U.S.C. 154(b) by 497 days.

(21) Appl. No.: 14/012,776

(22) Filed: Aug. 28, 2013

(65) Prior Publication Data

US 2014/0061550 A1   Mar. 6, 2014

Related U.S. Application Data

(60) Provisional application No. 61/697,118, filed on Sep. 5, 2012.

(51) Int. Cl.
| | |
|---|---|
| *C01G 41/02* | (2006.01) |
| *C01G 31/02* | (2006.01) |
| *C01G 39/02* | (2006.01) |
| *H01L 51/00* | (2006.01) |
| *H01L 51/42* | (2006.01) |

(52) U.S. Cl.
CPC ............. *C01G 41/02* (2013.01); *C01G 31/02* (2013.01); *C01G 39/02* (2013.01); *H01L 51/0021* (2013.01); *H01L 51/4253* (2013.01); *H01L 51/4226* (2013.01); *H01L 2251/308* (2013.01); *Y02E 10/549* (2013.01)

(58) Field of Classification Search
CPC ........ C01G 41/02; C01G 31/02; C01G 39/02; H01L 51/0021
USPC .............................. 423/606, 594.17; 252/518.1
See application file for complete search history.

(56) References Cited

U.S. PATENT DOCUMENTS

| | | | | |
|---|---|---|---|---|
| 5,252,354 A | * | 10/1993 | Cronin | G02B 1/10 427/126.3 |
| 5,804,151 A | * | 9/1998 | Sweetser | C01G 39/02 423/53 |
| 2005/0179012 A1 | * | 8/2005 | Kwon | C09K 9/02 252/582 |
| 2010/0233074 A1 | * | 9/2010 | Song | C01B 13/366 423/606 |

* cited by examiner

*Primary Examiner* — Matthew E Hoban
*Assistant Examiner* — James Fiorito
(74) *Attorney, Agent, or Firm* — Berkeley Law & Technology Group, LLP (57) ABSTRACT

Embodiments may pertain to methods for preparing a transition metal oxide.

21 Claims, 6 Drawing Sheets

SOLUTION-PROCESSED TRANSITION METAL OXIDES

BACKGROUND

1. Field

The present invention relates to, for example, low-temperature solution-based synthesizing transition metal oxides for use as hole transport or injection/collection layers in applications such as organic light emitting diodes, organic solar cells, and organic photodetectors, and for use in oxide-based photovoltaics and photodetectors, as well as functional circuits and systems based, at least in part, on such devices.

2. Information

Organic electronic and/or optoelectronic devices may typically comprise one or more organic layers sandwiched, for example, between two or more electrodes. In some instances, at least one of the electrodes may be at least partially transparent. Layers may include, for example, an anode, a cathode, and a buffer layer arranged among an anode and a cathode layer, which may permit hole or electron injection/collection and transport. When implemented in products, such as organic light electroluminescent devices, in the presence of an external bias, holes and/or electrons may be injected from an anode and cathode to form excitons, which may beneficially release electromagnetic energy in the form of visible light, for example.

BRIEF DESCRIPTION OF THE DRAWINGS

Claimed subject matter is particularly pointed out and distinctly claimed in the concluding portion of the specification. However, both as to organization and/or method of synthesis of metal oxides and device operation, together with objects, features, and/or advantages thereof, claimed subject matter may be better understood by reference to the following detailed description if read with the accompanying drawings in which:

Reference is made in the following detailed description to the accompanying drawings, which form a part hereof, wherein like numerals may designate like parts throughout to indicate corresponding or analogous elements. For simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references such as, for example, up, down, top, bottom, over, above and so on, may be used to facilitate the discussion of the drawings and are not intended to restrict application of claimed subject matter. Therefore, the following detailed description is not to be taken in a limiting sense and the scope of claimed subject matter is intended to be defined by the appended claims and equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses, and/or systems that would be known by one of ordinary skill have not been described in detail so as not to obscure claimed subject matter.

Reference throughout this specification to "one implementation," "an implementation," "one embodiment," "an embodiment," or the like, may mean that a particular feature, structure, or characteristic described in connection with a particular implementation or embodiment may be included in at least one implementation or embodiment of claimed subject matter. Thus, appearances of such phrases in various places throughout this specification are not necessarily intended to refer to the same implementation or to any one particular implementation described. Furthermore, it is to be understood that particular features, structures, or characteristics described may be combined in various ways in one or more implementations. In general, of course, these and other issues may vary with the particular context. Therefore, a particular context of the description or usage of these terms may provide helpful guidance regarding inferences to be drawn for the particular context.

Likewise, the terms, "and," "and/or," and "or" as used herein may include a variety of meanings that may, again, depend at least in part upon the context in which these terms are used. Typically, "and/or" as well as "or" if used to associate a list, such as A, B, or C, is intended to mean A, B, or C, here used in the exclusive sense, as well as A, B, and C. In addition, the term "one or more" as used herein may be used to describe any feature, structure, or characteristic in the singular or may be used to describe some combination of features, structures, or characteristics.

According to one or more embodiments, if a solar cell and/or an organic photodetector is irradiated under light, for example, incident energy may result in a separation of excitons into holes and electrons, for example, which may move in a direction from an anode to a cathode, which may result in generation of electric current. Metal oxide layers, for example, may play a role in organic and inorganic optoelectronic devices, which may possess a suitable electron band structure that benefits carrier injection/collection as well as enabling conductivity, which may be sufficient to transport carriers (e.g., holes and/or electrons). Metal oxides, for example, may be stable, processed with relative ease and may be compatible for large area production. In addition to potentially widespread use with interface circuits of optoelectronics, metal oxides, such as molybdenum oxide, vanadium oxide, and tungsten oxide, may give rise to electrochromism, due at least in part to fast response time, coloration efficiency, long lifetime, etc.

A metal oxide compound may be formed from a metal and oxygen. Metal oxides may comprise desirable carrier transport properties and capability to operate within an anode and/or a cathode electrode, owing, at least in part, to energy-alignment that is compatible with a wide range of organic materials. Transition metal oxides such as molybdenum oxide, vanadium oxide, and tungsten oxide, for example, may exhibit desirable hole injection/collection and transport properties. Typically, oxides of molybdenum, vanadium, and tungsten may be capable of forming ohmic contacts with organic materials in a manner that enhances, for example, hole injection/collection in organic optoelectronic devices. Other desirable characteristics of transition metal oxides, in comparison with other materials for carrier transport layers, may include prolonged stability in external environments, which may enhance the lifetime of organic devices.

Typical methods to deposit metal oxide film, such as by way of sputtering and/or thermal evaporation, may require high vacuum conditions, which may damage underlying organic films particularly when an organic film is formed by way of a sputtering method. Given the compatibility with large area, low cost, high-throughout production and all-solution technology, solution-processed transition metal oxides (TMO's) may attract signification attention from various research groups. Solution-processed TMOs layers derived from various precursor solutions, such as ammonium heptamolybdate, vanadium-oxitriisopropoxide and $[W(OC_2H_5)_6]$, for synthesis molybdenum oxide, vanadium oxide, and tungsten oxide solution may continue to gain in popularity. Among these solution-processed TMOs, there may be many drawbacks, however, such as rough film, which may require high temperature thermal annealing, dispersion of a film in an aqueous solution, which may render an organic device unsuitable for organic devices, or may require and organic device to undergo additional hydrolyzing. These drawbacks may reduce the appeal of solution processed TMOs in, for example, organic electronics.

In embodiments, it is contemplated that a common method for synthesis of typical hole transport metal oxides such as molybdenum oxide, vanadium oxide, and tungsten oxide may be used. Moreover, solution-processed TMOs (e.g., molybdenum oxide, vanadium oxide, tungsten oxide, etc.) derived according to various embodiments may overcome one or more drawbacks inherent in previous work approaches. Embodiments may describe a general method, which may be applied to a variety of TMOs and may comprise a single step, thereby rendering example embodiments of a process both simple and cost effective. The obtained TMOs may be dispersed uniformly, and with enhanced ease, into water-free solvents. Water-free solvents may include alcohol-based solvents, such as ethanol, which is described herein. Accordingly, benefits pertaining in particular to device stability and enhanced service life of organic electronics may be realized. Moreover, using low temperature treatments, such as, for example, treatments that may occur between approximately 80.0° C. and approximately 100.0° C., resulting TMO films may exhibit high film quality and/or desirable electrical properties. It should be noted, however, that some TMOs may be processed using somewhat lower temperatures, such as approximately 75.0° C., 65.0° C., or even lower temperatures, or may be processed using somewhat higher temperatures, such as approximately 110.0° C., approximately 120.0° C., and so forth. TMO films may also exhibit high quality with further increase of an annealing temperature.

As will be discussed in detail below, typical solution-processed transition metal oxides (TMOs) may be synthesized, for example, by oxidizing a metal using hydrogen peroxide and controlling or moderating a reaction by way of an addition of ethanol. Stoichiometry of a reaction may be moderated or controlled by adjusting, for example, amount of hydrogen peroxide added to a reaction. Further, although a significant portion of the discussion herein may relate to use of molybdenum, vanadium, tungsten, and so forth, it is contemplated that the one or more methods described herein may apply to other transition metals, such as scandium, chromium, manganese, cobalt, and so forth. Further, although hydrogen peroxide may be discussed herein, other peroxides may be used, such as, for example, lithium peroxide, and/or any other use of compounds for which an oxidation state of oxygen is equal to −1.

The term "TMOs" may refer to transition metal oxides which may be used as a hole transport layer in organic electronics, such as molybdenum oxide, vanadium oxide, tungsten oxide, and so forth. TMOs may be dispersed uniformly using a threshold degree of stability into water-free solvents, such as alcohol-based solvents, for example. TMO films may require low temperature treatment, which may be less than, for example, approximately 100.0° C. although, some TMO films may require higher temperatures, such as approximately 110.0° C., 125.0° C., or higher. TMO films may be thoroughly stoichiometric, for example, or may be at least partially stoichiometric with a small amount of oxygen deficiency. TMO films may be smooth and absent of pinholes. TMO films may be highly transparent for a wide range of a solar energy spectrum. TMOs may have suitable band structures for employment in electronics, for example, that may employ organic light electroluminescent devices.

TMOs may have applications in, for example, organic electroluminescent devices, organic solar cells, organic photodetectors, oxide based photodetectors, and photovoltaics, as well as circuits that may be used in related devices, for example. In some embodiments, TMOs may be employed as, for example, an anode buffer layer which may bring about hole transport in organic electronics. For example, TMOs may be fabricated, for example, between anode metal and an organic layer for use with an organic light emitting diode, which may give rise to hole injection. TMOs may also be used as an anode buffer layer in organic solar cells and/or organic photodetectors for hole collection, for example.

TMOs may be used in conjunction with a standard architecture, for example, in which an anode is located near a bottom portion of a device. TMOs may also be used in an inverted architecture in which an anode is located on near a top portion of an organic active layer and without negatively impacting device performance if, for example, a TMO films is spin-coated from water-free solutions. However, outside available TMOs may not have suitable performance, such as in an aspect of high temperature treatment, and/or extra treatment such as oxygen plasma, and/or requirement of dispersion into water.

In at least one embodiment, photovoltaic devices may be constructed, wherein a TMOs may be employed in a hole transport layer. Such photovoltaic devices may exhibit desirable performance. Photovoltaic devices may be utilized to power, for example, electronic devices such as mobile telephones, laptop computers, iPads and other tablet computers, etc. Such photovoltaic devices may demonstrate, for example, desirable hole transport layers by substituting more commonly used materials, such as poly(3,4-ethylenedioxythiophene), poly(styrenesulfonate), and/or (PEDOT: PSS). Experimental results indicate enhanced photovoltaic performance for organic solar cells employing TMOs as hole transport layer in comparison with photovoltaic performance of organic solar cells employing PEDOT: PSS.

TMOs may be realized by, for example sputtering. However, such method may not be commonly used since, for example, processing may require vacuum environment, which may give rise to damage of underlying organic materials if the TMOs films is fabricated on top, for example. Typical TMOs may also be realized by using thermal evaporating. However, such processing may, again, at least in some implementations, require at least a partial vacuum condition. Accordingly, typical processes may be incompatible with at least some aspects of all solution-processing and/or large area production. Typical solution-processed TMOs may be realized from one or more precursors. However, high temperature may be required for the conversion of the precursor into the TMOs. Again, such high temperature may damage TMOs that result from such a process, for example.

Solution-processed TMOs may also be realized from commercially available TMO nanoparticles. However, at least in some instances, extra oxygen-plasma treatment may be used to remove the dispersing agent. Such processes may, however, result in surface roughness and pin-holes. Such roughness and pinholes may, for example, be undesirable for use with in at least some applications.

In some instances, solution-processed TMOs may be realized by dispersing one or more precursors into an aqueous solution such as, for example, distilled water. However, an aqueous solution may introduce stability issues that may degrade device lifetime, and thus may be incompatible with, for example, organic electronics applications. Solution-processed TMOs layers may be derived from, for example, various precursors, such as ammonium heptamolybdate for synthesis molybdenum oxide solution, vanadium-oxitriisopropoxide for synthesis of vanadium oxide solution, and $[W(OC_2H_5)_6]$, for synthesis of a tungsten oxide solution. TMOs derived from precursors may, at least in some instances, bring about transfer of undesirable ingredients brought about by an incomplete decomposition of a precursor. However, at least in some embodiments, such apparent shortcomings are reduced or even eliminated.

Organic light emitting devices may be commercialized for use in display and/or solid-state lighting applications. Organic solar cells, for example, may also be commercialized for use in constructing environmentally friendly. Other organic electronic and/or optoelectronic devices using solution-processed TMOs may be developed, and claimed subject matter is not limited to particular devices and/or implementations of TMOs. Synthesis and/or employment of TMOs may be demonstrated using various organic devices, and improved synthesis of TMOs may give rise to enhanced materials that may exhibit desirable electrical properties.

As will be described in detail, organic solar cells may be based, at least in part, on TMOs operating in a hole transport layer, for example. In at least one implementation, organic solar cells may be formed in which a TMO layer may be disposed between indium-tin-oxide (ITO) coated glass substrate and an organic active layer, without adopting the commonly used PEDOT: PSS. Such an organic solar cell may exhibit superior photovoltaic performance.

EXAMPLES

Examples embodiments provided below are not intended to import limitations into claimed subject matter. Rather, examples and implementations described below may provide details that may enable one of ordinary skill in the art to practice the claimed invention.

In one example, metal powders (e.g., molybdenum, vanadium, and tungsten) were purchased from Aladdin Reagent at Suite 601, Shanda Building, No. 196 Xinjinqiao Road, Pudong District, Shanghai 201206, China. An amount of approximately 0.1 gram metal powder of molybdenum, vanadium, and tungsten were each dispersed in 10 milliliter of ethanol into an approximately 10.0 milliliter container and stirred magnetically. Approximately 0.35 milliliter, 0.5 milliliter, and 2 milliliter $H_2O_2$(30%) solution were added to each of the three metal powder (molybdenum, vanadium, and tungsten) suspension solutions. After approximately 18.0 hours, the molybdenum oxide solution turned from grey to yellow and then to blue. After approximately 3.0 hours, the vanadium oxide solution turned to orange and then to brown. A relatively colorless solution of tungsten oxide was obtained after approximately 3.0 hours of reaction.

The molybdenum, vanadium, and tungsten oxide solutions were each dried in an at least a partially evacuated environment. Dried molybdenum oxide, dried vanadium oxide, and dried tungsten oxide were each dispersed, approximately uniformly, into approximately 10.0 milliliters of ethanol. It is noted that by increasing an amount of ethanol, reaction rate may be shown to be reduced. Functions of ethanol may be described, at least in theory, as (i) ethanol alleviating an intense reaction that may occur between metal powders (e.g., molybdenum, vanadium, and tungsten) and hydrogen peroxide in a manner that permits reaction rate between metal powders and hydrogen peroxide can slow down; and (ii) ethanol may operate as a reducing agent and hydrogen ion insertion source. It was noted that during the reaction, ethanol appears to provide e– and $H^+$ for the reduction of the metal peroxide and meanwhile small amount of $H^+$ may insert into the TMO lattice. However, claimed subject matter is not intended to be limited in this respect.

ITO-coated glass substrates with sheet resistance of 15Ω/☐ were cleaned and then treated for approximately 15.0 minutes using ultraviolet-ozone. For standard devices, either poly(3,4-ethylenedioythiophene): poly(styrenesulfonate) (PEDOT: PSS, Baytron AI 4083) or transient metal oxides (TMOs: molybdenum oxide, vanadium oxide, and tungsten oxide) was spin-coated on the ITO glass. The thickness of PEDOT:PSS and TMOs was estimated to be approximately 30.0 nm and approximately 8.0 nm, respectively. The PEDOT: PSS, molybdenum oxide, vanadium oxide and tungsten oxide films were annealed at approximately 140.0° C., approximately 80.0° C., approximately 100.0° C., and approximately 100.0° C., respectively, for approximately 10.0 minutes on a hotplate in an air environment. For inverted devices, titanium dioxide may be spin-coated onto the ITO glass with a thickness of approximately 30.0 nm, and annealed at approximately 150.0° C. for approximately 10.0 minutes. However, in some implementations PEDOT: PSS may be annealed at, for example, a temperature of between approximately 120.0° C. to approximately 160.0° C. In some implementations, molybdenum oxide and vanadium oxide may be annealed at, for example, a temperature of approximately 60.0° C. to approximately 240.0° C. In some implementations, tungsten oxide films may be annealed at, for example, a temperature of approximately 80.0° C. to approximately 160.0° C. In some implementations, titanium dioxide may be annealed at, for example, a temperature of between approximately 110.0° C. to 160.0° C. In some implementations, the spin-cast vanadium oxide, molybdenum oxide and tungsten oxide films may be treated under vacuum environment without any temperature treatment.

Metal oxide samples were transferred into an isolation box (e.g., glove box) to spin-coat an active layer. An active layer comprising a blend of poly(3-hexylthiophene) (P3HT) and [6,6]-phenyl-$C_{61}$ butyric acid methyl ester ($PC_{61}BM$) (1:1, 40 mg/ml in 1,2-dichlorobenzene (DCB)) having a thickness of approximately 220.0 nm. Solvent annealing was conducted and samples annealed at 130.0° C. for approximately 10.0 minutes. For standard devices, Ca (approximately 20.0 nm)/Al (approximately 80.0 nm) were thermally evaporated as a cathode with a device area of 4.5 $mm^2$ defined by a shadow mask. For inverted devices, molybdenum oxide was spin-coated onto an organic active layer with a thickness of approximately 8.0 nm, and placed into a vacuum chamber for pumping approximately 10.0 min without any temperature treatment. Approximately 100.0 nm Ag was thermally evaporated as the anode with a device area of approximately 4.5 $mm^2$ defined by a shadow mask.

Ultraviolet photoelectron spectroscopy (UPS) spectra were obtained using a He discharged lamp (He 121.22 eV, which may be obtained from Kratos Analytical at Trafford Wharf Road, Wharfside, Manchester M17 1GP, United Kingdom) with an experimental resolution of 0.15 eV. Samples were biased at −10 V to favor observation of secondary-electron cut-off from the UPS spectra. X-ray photoelectron spectroscopy (XPS) measurement was carried out using a Physical Electronics 5600 multi-technique system (monochromatic Al Kα X-ray source, available from Physical Electronics, located at 18725 Lake Drive East, Chanhassen, Minn. 55317). All spectra were adjusted according to the standard value of C 1s peak (binding energy) at approximately 284.6±0.1 eV. Surface morphology of TMO oxide was measured by using an Atomic force microscope (AFM) (model: NanoScope III from Digital Instruments located at 580 Ensminger Road, Tonawanda, N.Y. 14150) in tapping mode. Transmittance measurement was performed under a substantially dark ambient environment using an M-2000 ellipsometer available from J. A. Woollam Co., located at 645 M Street, Suite 102, Lincoln, Nebr. 68508-2243. Current density (J)-Voltage (V) characteristics were obtained by using a Keithley 2635 source meter and Newport AM 1.5G solar simulator with 100 mW/$cm^2$ illumination available from Keithley Instruments, 28775 Aurora Road, Cleveland, Ohio 44139.

Results

Figure 1:
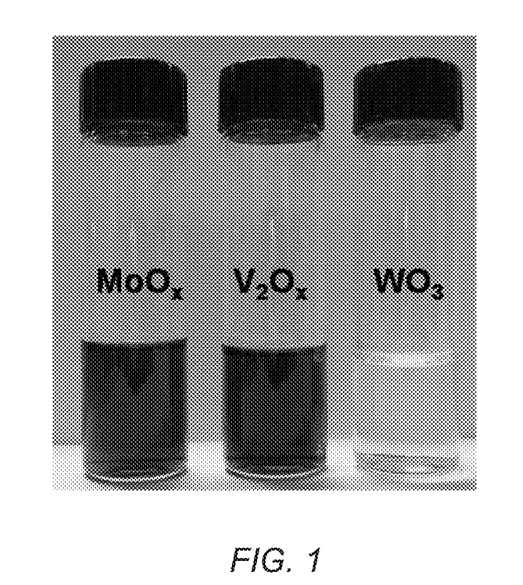
FIG. 1 is a representation of molybdenum oxide, vanadium oxide, and tungsten oxide solutions in transparent bottles according to one or more embodiments.
Figure 2:
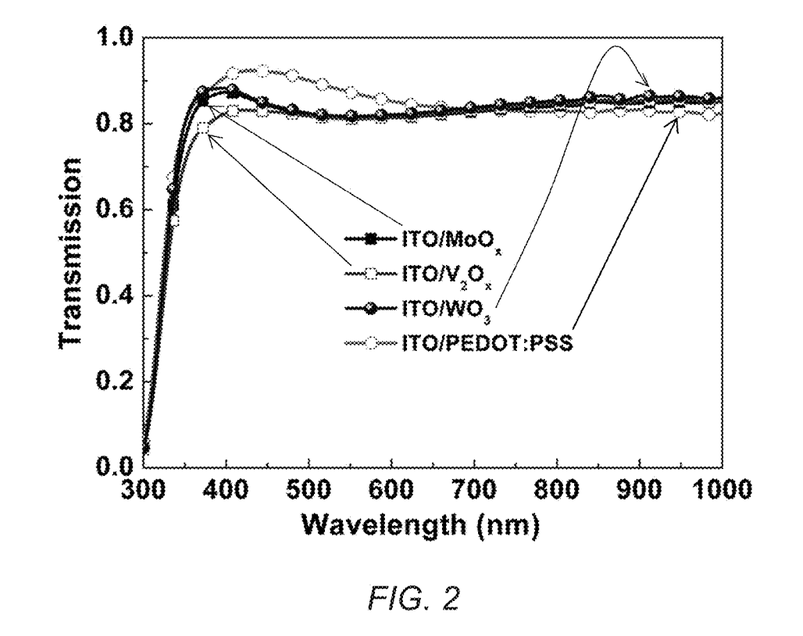
FIG. 2 is a graph showing transmittance spectra of molybdenum oxide, vanadium oxide, and tungsten oxide and PEDOT (PSS thin films on indium-tin-oxide (ITO) coated glass substrate) according to one or more embodiments.

FIG. 1 is a representation of molybdenum oxide, vanadium oxide, and tungsten oxide solutions in transparent bottles according to one or more embodiments. FIG. 2 illustrates transmission spectra of three TMO thin films on ITO glass substrate with the spectrum of PEDOT: PSS included for comparison. A thickness of TMO films may be determined by ellipsometry to be around approximately 8.0 nm, which may be an desirable thickness for functioning as hole transport layer (HTL) in organic solar cells (OSCs) as discussed later. Light transmission of TMO films may be comparable to that of PEDOT: PSS and higher in a long wavelength region (e.g., infrared), which may be expected to benefit small band gap OSCs. Light transmission may also indicate that TMOs may act as effective intermediate layers in tandem cells where a top cell may employ infrared organic materials to bring about long wavelength solar spectrum energy conversion.

Figures 3A, 3B, 3C, 3D:
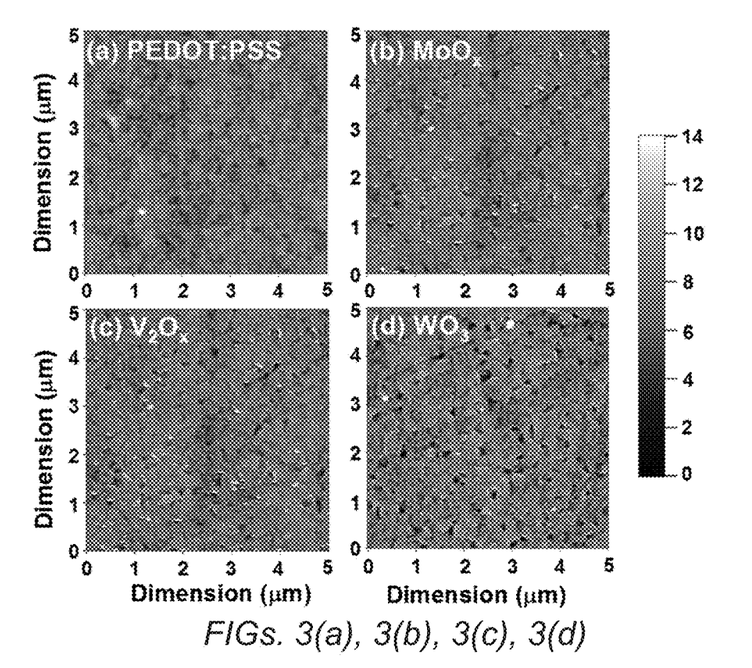
FIG. 3 is a graph illustrating the two dimensional atomic force microscope (AFM) images of thin films: (a) PEDOT: PSS; (b) molybdenum oxide, (c) vanadium oxide, and (d) tungsten oxide according to one or more embodiments.

FIG. 3 illustrates the AFM images of solution-processed TMOs. Images may show uniform and smooth surface for the three TMOs with root-mean-square (RMS) roughness of approximately 1.33 nm, approximately 1.30, nm and approximately 1.46 nm for molybdenum oxide, vanadium oxide, and tungsten oxide, respectively, which is comparable to that of PEDOT:PSS (RMS approximately 1.07 nm). Flatness of the surface and absence of nano-scopic voids or porosity may indicate that materials pack well to form film. High quality of the TMO thin films suggests that TMO thin films may smooth an ITO surface efficiently and avoid local shorts. TMO thin films are also dense enough to prevent current leakage, which may be a prerequisite to use as a buffer layer for organic electronics.

Figure 4:
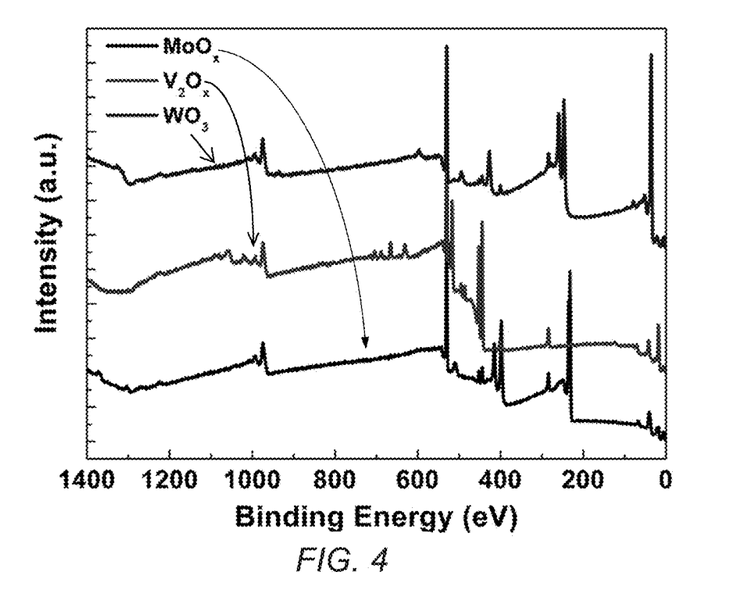
FIG. 4 is a graph illustrating the full scans of X-ray photoelectron spectroscopy (XPS) of molybdenum oxide, vanadium oxide, and tungsten oxide according to one or more embodiments.
Figure 5A:
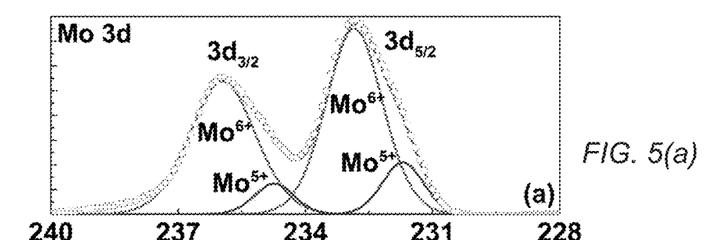
FIG. 5 is a graph illustrating the XPS spectra of (a) Mo 3d core level in molybdenum oxide; (b) V 2p core level in vanadium oxide; (c) W 4f core level in tungsten oxide along with decomposition of the XPS spectra according to one or more embodiments.

FIGS. 4 and 5 illustrate the XPS spectra, wherein spectra may be adjusted according to a standard value of C 1s peak at approximately 284.6±0.1 eV. For molybdenum oxide film, the Mo 3p core level may be peaked at 398.2 eV as shown in FIG. 4, suggesting, for example, a nearly stoichiometric $MoO_3$ film composition. A nearly stoichiometric film composition may be further evidenced by an Mo 3d doublet feature represented as symbols in FIG. 5(*a*). Mo $3d_{5/2}$ and $3d_{3/2}$ may be centered at approximately 232.8 eV and approximately 235.9 eV, respectively, which may be typical values of the 3d doublet of $Mo^{6+}$ oxidation state. Decomposition of an XPS spectrum reveals that it can fit by two 3d doublets in the form of, for example, one or more Gaussian functions, corresponding to molybdenum in two different oxidation states. A major contributor as may appear to be a 3d doublet of $Mo^{6+}$, appears to peak at approximately 232.8 eV and approximately 236.0 eV, while a minor peak may be centered at approximately 231.7 eV and at approximately 234.7 eV, identified as 3d doublet of $Mo^{5+}$. Atomic concentration ratio of $Mo^{6+}$ to $Mo^{5+}$ may be obtained to be approximately 6.0:1.0, which may indicate that molybdenum is almost fully oxidized with slight oxygen deficiency.

Figure 5B:
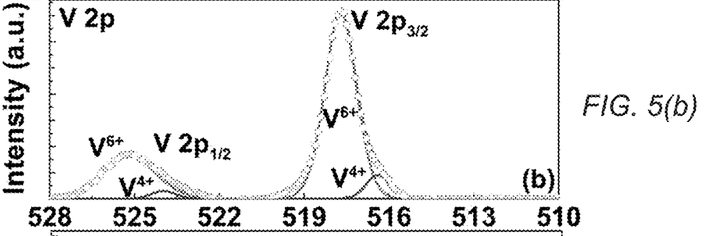

As it pertains to vanadium oxide, an apparent center of a core level of V $2p_{3/2}$ at approximately 517.7 eV may indicate composition of predominantly $V_2O_5$ as shown in FIG. 5(b), which may be consistent with a previous report where V $2p_{3/2}$ is centered at approximately 517.2 eV for a single crystal $V_2O_5$. An XPS spectrum may comprise two Gaussian-like 2p doublets which, according to characteristic values, may correspond to $V^{5+}$ and $V^{4+}$ oxidization states, respectively. Composition analysis reveals that, for example, $V^{4+}$ may account for a small amount, approximately 8.0%, for example, of a total number of vanadium atoms, which may further confirm that the obtained vanadium oxide comprises a stoichiometry of nearly $V_2O_5$, for example.

Figure 5C:
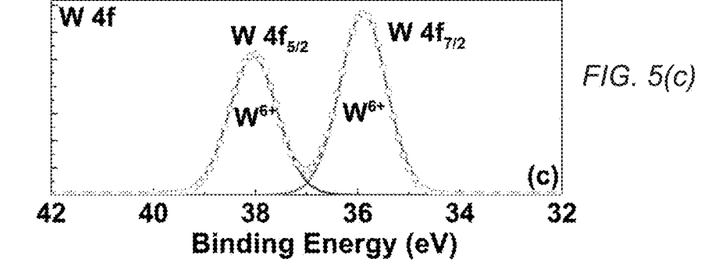

For a tungsten oxide embodiment, binding energy of W $4f_{7/2}$ and W $4f_{5/2}$ may approximate 35.9 eV and 38.0 eV, respectively, which may represent typical values corresponding a predominant state of $WO_3$. Decomposition analysis may suggest an absence of additional tungsten states other than $W^{6+}$, as shown in FIG. 5(c), for example. Results may show that tungsten oxide has the form of $WO_3$.

Figure 6:
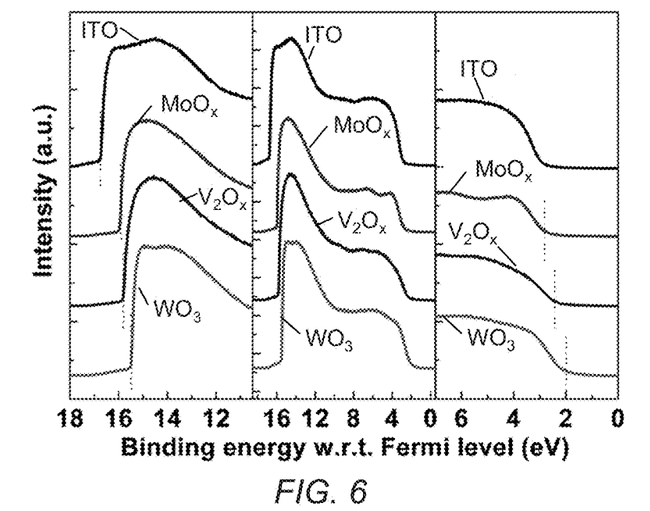
FIG. 6 is a graph illustrating the ultraviolet photoelectron spectroscopy (UPS) for ITO, molybdenum oxide, vanadium oxide, and tungsten oxide: photoemission onset (left); full valence spectra (middle); density of states near the oxide valence band edge (right), according to one or more embodiments.
Figure 7:
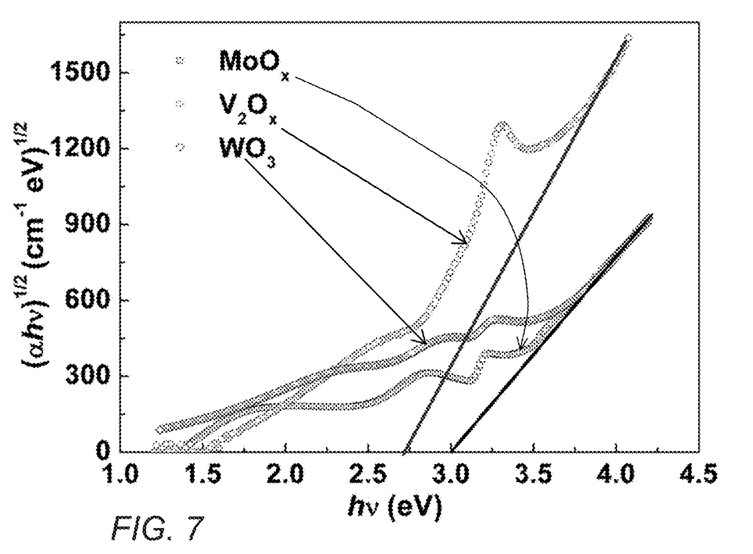
FIG. 7 is a graph illustrating the relationship between $(\alpha h\nu)^{1/2}$ and photon energy (hν) for molybdenum oxide, vanadium oxide, and tungsten oxide, respectively, where α is absorption coefficient according to one or more embodiments.
Figure 8:
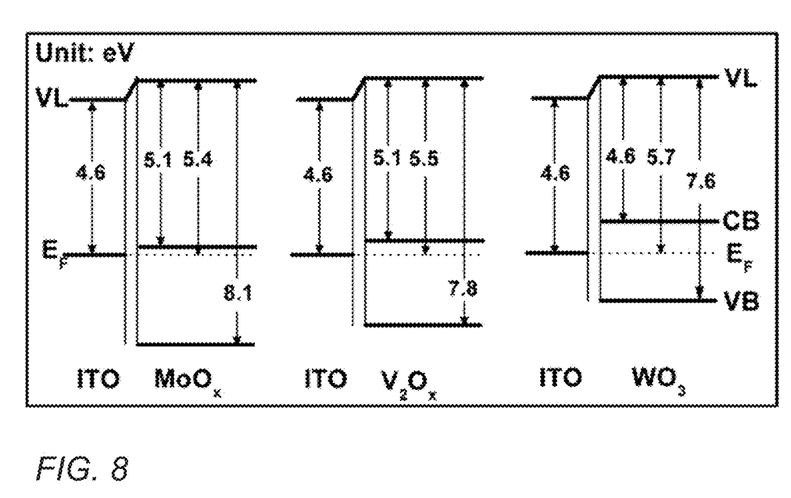
FIG. 8 is a schematic diagram illustrating the energy diagrams for ITO/molybdenum oxide (left), ITO/vanadium oxide (middle) and ITO/tungsten oxide (right) according to one or more embodiments.

A UPS spectrum of the left-hand pane in FIG. 6 may shows a photoemission onset, and the centered panel shows a full He 1 UPS spectra. Density states spectra near an oxide valance band (VB) edge are displayed in the right-hand pane. Binding energies are values that may be relative to a Fermi level. An optical band gap ($E_{opt}$) may be derived following Tauc's formula as shown in FIG. 7, in which, for example, a relationship between $(\alpha h v)^{1/2}$ and hv is plotted. The constant α may correspond to an absorption coefficient and hv may correspond to photon energy. By extrapolating, for example, a linear portion of the curve of FIG. 7, curve to an energy axis, an intersection may be identified as $E_{opt}$. The work function (WF) of ITO, molybdenum oxide, vanadium oxide, and tungsten oxide be estimated to be approximately 4.6 eV, approximately 5.4 eV, approximately 5.5 eV, and approximately 5.7 eV, respectively. Optical band gaps may approximate 3.0 eV, 2.7 eV and 3.0 eV, respectively. Other band diagram parameters may comprise electron affinity (EA) and ionization energy (IE) and may be shown in FIG. 8.

TMOs of molybdenum oxide, vanadium oxide, and tungsten oxide may, at one time, have been considered as p-type metal oxides such that holes may transport through the valence band, for example. However, more recent investigations may reveal that TMOs may comprise an n-type with very low-lying conduction band. As a result, hole transporting through a TMO may be realized by collection of electrons transporting through a conduction band. As it pertains to molybdenum oxide and vanadium oxide, results described herein, for example, may be consistent with an n-type material, in which band structure parameters may agree well with at least some previous investigations. N-type band configuration may result from oxygen vacancies. In embodiments, small amounts of oxygen vacancies have been reported to be capable of causing effective n-type doping. Tungsten oxide, however, may show nearly intrinsic characteristic with Fermi level ($E_F$) located near a middle of a bandgap, which may be consistent with XPS analysis. It may be a trend that energy level alignment can be achieved between TMOs with a wide range of work functions and organic molecules through Fermi level pinning transition, for example. This principle may apply to the investigated molybdenum oxide or vanadium oxide/organic interface, for example. While the principle may not apply to the tungsten oxide/organic interface given that the insulating property of tungsten oxide may inhibit the charger transfer and thus Fermi level pinning may be difficult or problematic to achieve. Thus, molybdenum oxide and vanadium oxide may be expected to be better HTL than tungsten oxide when employed in organic electronics.

Figure 9:
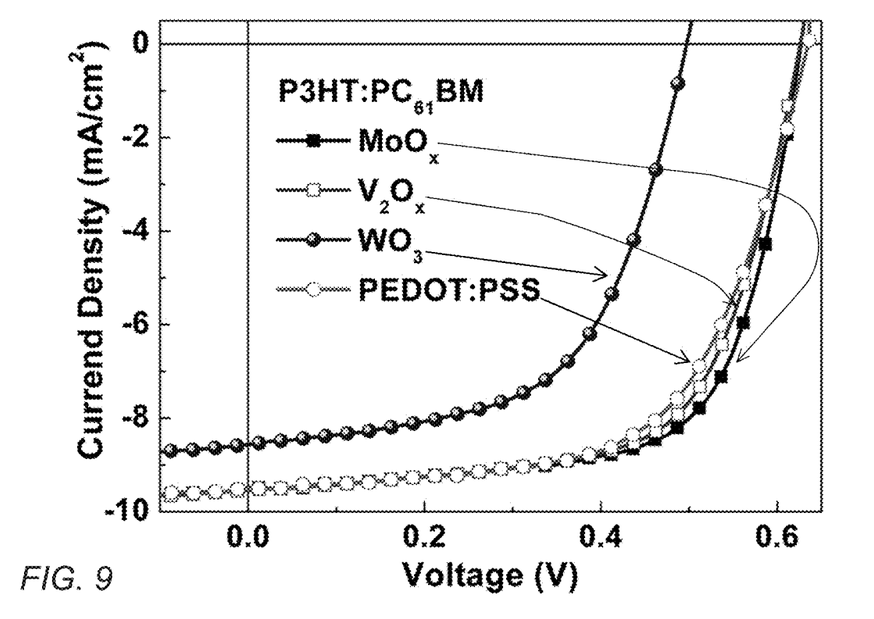
FIG. 9 is a graph illustrating the current density-voltage (J-V) characteristics under AM1.5G solar spectrum with light intensity of 100 mW/cm$^2$ for organic solar cells employing molybdenum oxide, vanadium oxide, and tungsten oxide, and PEDOT: PSS as hole collection layer with the device structure: ITO/molybdenum oxide, vanadium oxide, and tungsten oxide (8 nm) or PEDOT: PSS(30 nm)/P3HT: PC$_{61}$BM(220 nm)/Ca(20 nm)/Al(100 nm) according to one or more embodiments.
Figure 10:
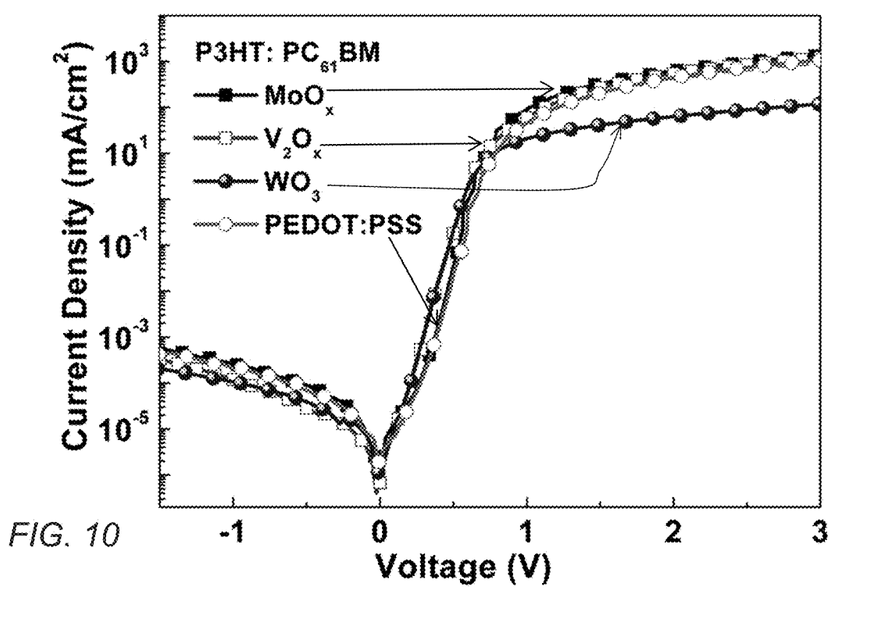
FIG. 10 is a graph illustrating the current density-voltage (J-V) characteristics under dark for organic solar cells employing molybdenum oxide, vanadium oxide, and tungsten oxide, and PEDOT: PSS as hole collection layer with the device structure: ITO/molybdenum oxide, vanadium oxide, and tungsten oxide (8 nm) or PEDOT: PSS (30 nm)/P3HT: PC$_{61}$BM (220 nm)/Ca (20 nm)/Al (100 nm) according to one or more embodiments.

To demonstrate effectiveness of TMOs synthesized by a method that accords with at least some embodiments as HTL, OSCs were fabricated and characterized. Conventional OSCs may comprise device structures as ITO/TMOs or PEDOT: PSS/P3HT: $PC_{61}BM/Ca/Al$. Photovoltaic performance may be summarized in Table 1 and illustrated in FIGS. 9 and 10, for example. Molybdenum oxide, vanadium oxide, and tungsten oxide treated at a temperature as low as approximately 80.0° C., approximately 100.0° C., and approximately 100.0° C., respectively may achieve suitable performance. In embodiments, by using molybdenum oxide, vanadium oxide and tungsten oxide as HTL, an average PCE for P3HT: $PC_{61}BM$-based OSCs are approximately 3.94% and approximately 3.86%, approximately 2.37% respectively. A PCE of molybdenum oxide, vanadium oxide devices may be superior to OSCs based on PEDOT: PSS (average PCE of approximately 3.68%). Compared to the PEDOT: PSS-based OSCs, for example, a comparable open-circuit voltage ($V_{OC}$) may suggest favorable band alignment for hole collection if employing molybdenum oxide or vanadium oxide as HTL, for example.

Reduced series resistance ($R_S$) and enhanced fill factor (FF) indicate good conductivity of the TMO films and low barrier for efficient hole collection at the organic/TMO interface, for example. Very large rectification ratio (over $10^5$) may be a typical indicator of good diode characteristics suggesting the TMO layer may act to polarize an internal electric field of OSCs. If tungsten oxide is used as HTL, for example, $WO_3$ intrinsic properties may lead to two consequences: (1) energy level misalignment at the interface, which may be due to unrealized Fermi level pinning that results in a reduced $V_{OC}$; and (2) an insulating property of tungsten oxide may give rise to large resistance for a thin film. Accordingly, a device performance of using $WO_3$ as HTL may be inferior to that of PEDOT: PSS-based OSCs.

Table 1 shows photovoltaic parameters for organic solar cells with molybdenum oxide, vanadium oxide, and tungsten oxide and PEDOT: PSS as hole transport layer, respectively. A device structure may correspond to, for example, ITO/molybdenum oxide, vanadium oxide, and tungsten oxide or PEDOT: PSS/P3HT: $PC_{61}BM/Ca/Al$. All values an Table 1 are approximate.

|  | $V_{OC}$ (V) | $J_{SC}$ (mA/cm$^2$) | FF (%) | PCE (%) |
| --- | --- | --- | --- | --- |
| molybdenum oxide | 0.625 ± 0.001 | 9.38 ± 0.31 | 67.15 ± 0.97 | 3.94 ± 0.13 |
| vanadium oxide | 0.625 ± 0.000 | 9.71 ± 0.12 | 63.61 ± 0.98 | 3.86 ± 0.02 |
| tungsten oxide | 0.489 ± 0.019 | 8.60 ± 0.44 | 56.48 ± 2.14 | 2.37 ± 0.10 |
| PEDOT: PSS | 0.633 ± 0.005 | 9.28 ± 0.32 | 62.69 ± 2.17 | 3.68 ± 0.11 |

Figure 11:
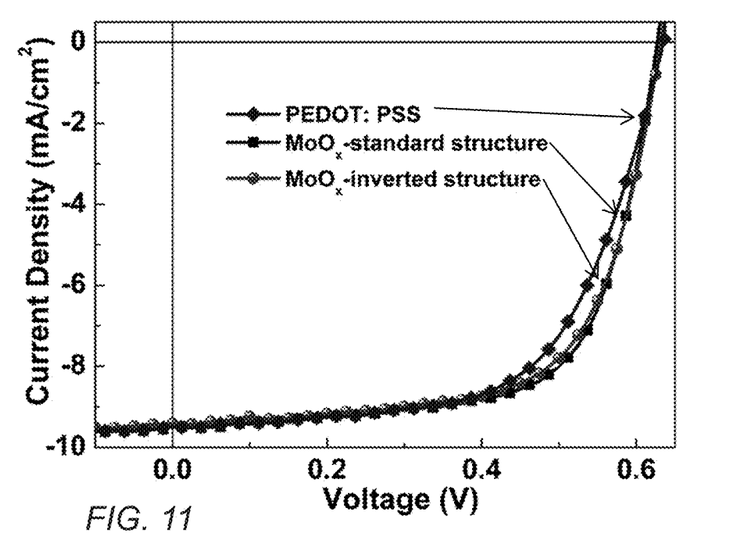
FIG. 11 is a graph illustrating the current density-voltage (J-J) characteristics under AM1.5G solar spectrum with light intensity of 100 mW/cm$^2$ for the inverted organic solar cells with structure ITO/TiO$_2$(30 nm)/P3HT: PC$_{61}$BM(220 nm)/MoO$_3$(8 nm)/Al(100 nm) compare with the standard device structure and control device ITO/molybdenum oxide (8 nm) or PEDOT: PSS(30 nm)/P3HT: PC$_{61}$BM(220 nm)/Ca(20 nm)/Al(100 nm) according to one or more embodiments.

A solution-processed TMOs layer coated on organic layer in inverted devices may embody several desirable requirements, such as low temperature thermal annealing, compatible solvents, or the like. The solution-processed TMOs derived from the proposed method may comprise these merits. An inverted OSCs with device structures as ITO/TiO$_2$/P3HT: PC$_{61}$BM/molybdenum oxide/Ag may be fabricated to demonstrate and effectiveness of solution-processed TMOs in the inverted device. Photovoltaic performance is shown in Table 2 and illustrated in FIG. 11, for at least one embodiment. By using molybdenum oxide as HTL, average PCE for P3HT: PC$_{61}$BM-based inverted OSCs are approximately 3.84%, as well as the standard device with PCE of approximately 3.94%. Table 2 may provide photovoltaic parameters for inverted organic solar cells with molybdenum oxide and as a hole transport layer. The device structure is ITO/TiO$_2$/P3HT: PC$_{61}$BM/MoO$_x$/Ag. All values in Table 2 are approximate.

|  | $V_{OC}$ (V) | $J_{SC}$ (mA/cm$^2$) | FF (%) | PCE (%) |
|---|---|---|---|---|
| molybdenum oxide (standard structure) | 0.625 ± 0.001 | 9.38 ± 0.31 | 67.15 ± 0.97 | 3.94 ± 0.13 |
| molybdenum oxide (inverted structure) | 0.631 ± 0.007 | 9.34 ± 0.16 | 65.19 ± 0.95 | 3.84 ± 0.065 |

It may be worth emphasizing that the effectiveness of TMOs as HTL in organic electronics requires only very thin film thickness (~8 nm) and very low temperature treatment (no greater than 100° C.). The very thin TMO films allow more solar light transmission into the active layer for harvesting and meanwhile avoiding energy loss due to carrier transport in HTL. The very low processing temperature provides the excellent compatibility when these TMOs are employed on top of organic materials in inverted OSCs or as intermediate layer in tandem cells.

In summary, embodiments include a general method comprising a single step used in synthesizing in to synthesize low temperature solution-processed TMOs, such as molybdenum oxide, vanadium oxide, tungsten oxide, and others, is described. TMOs may be dispersed uniformly and stably into, for example, water-free solvents. Revealed by XPS, molybdenum oxide and vanadium oxide appear to be nearly in the MoO$_3$ and V$_2$O$_5$ stoichiometry, respectively with small amount of oxygen vacancy. Tungsten oxide may be nearly or, in some embodiments, completely in accordance with WO$_3$ stoichiometry. In addition to desirable material, optical, and electrical properties, all TMOs require a very low temperature treatment (no greater than approximately 100.0° C.) and film thickness as thin as approximately 8.0 nm may be adequate for effectiveness as efficient HTL in organic electronics. In embodiments, for molybdenum oxide or vanadium oxide used as HTL in OSCs, photovoltaic performances of OSCs based on TMOs may be superior to PEDOT: PSS-based OSCs. The investigated low-temperature solution-processed TMOs described herein may be expected to be applicable for cost-effective organic electronics such as all solution-processed OSCs and tandem cells towards high efficiency.

In the preceding description, various aspects of claimed subject matter have been described. For purposes of explanation, specific numbers, systems or configurations are set forth to provide a thorough understanding of claimed subject matter. However, it should be apparent to one skilled in the art having the benefit of this disclosure that claimed subject matter may be practiced without the specific details. In other instances, well-known features are omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes that fall within the spirit of claimed subject matter.

What is claimed is:

1. A method comprising:
   preparing a solution of an alcohol-based solvent and a transition metal; and
   adding a peroxide to the solution.

2. The method of claim 1, wherein the peroxide comprises hydrogen peroxide.

3. The method of claim 1, wherein the alcohol-based solvent is ethanol.

4. The method of claim 1, wherein the solution comprises:
   an amount of the alcohol-based solvent to affect a rate of reaction of the transition metal with the peroxide in combination.

5. The method of claim 1, wherein the transition metal comprises one of the group consisting of vanadium, molybdenum, and tungsten.

6. The method of claim 1, further comprising:
   drying the solution of the peroxide and the transition metal with the alcohol-based solvent to form an at least partially dried transition metal oxide.

7. The method of claim 6, further comprising:
   combining at least one water-free solvent with the at least partially dried transition metal oxide.

8. The method of claim 6, the drying comprises:
   creating the at least partially dried transition metal oxide in a vacuum environment.

9. The method of claim 6, further comprising:
   dispersing the at least partially dried transition metal oxide into a water-free solvent to form a dispersed solution.

10. The method of claim 9, further comprising:
    forming a transition metal oxide film.

11. The method of claim 10, the forming comprises:
    spin-coating the dispersed solution onto a substrate to form the transition metal oxide film.

12. The method of claim 11, further comprising:
    forming an organic device that includes the transition metal oxide film.

13. The method of claim 12, wherein the organic device comprises at least one of an organic light emitting diode, an organic solar cell, or an organic photodetector.

14. The method of claim 10, wherein the forming comprises
    annealing the transition metal oxide film at a temperature approximately between approximately 60.0° C. and approximately 240.0° C.

15. The method of claim 14, wherein the transition metal oxide film comprises molybdenum oxide.

16. The method of claim 14, wherein transition metal oxide film comprises vanadium oxide.

17. The method of claim 14, wherein said transition metal oxide film comprises tungsten oxide, and wherein said tungsten oxide is annealed at a temperature of approximately 80.0° C. to approximately 160.0° C.

18. A method comprising:
    preparing a transition metal oxide, wherein a transition metal dispersed in an alcohol-based solvent is oxidized by way of a peroxide solution, wherein the alcohol-based solvent is combined with the transition metal followed by the peroxide solution; and vacuum-pumping the transition metal, the peroxide solution, and the alcohol-based solvent to form an at least partially dried transition metal oxide; and dispersing the at least partially dried transition metal oxide in a water-free solvent to form a transition metal oxide film.

19. The method of claim 18, further comprising:
annealing the transition metal oxide film.

20. The method of claim 19, wherein the annealing occurs at a temperature less than approximately 100.0° Celsius.

21. The method of claim 18, wherein the transition metal comprises one of the group consisting of vanadium, molybdenum, and tungsten.

* * * * *